(12) United States Patent
Vekris et al.

(10) Patent No.: US 6,264,742 B1
(45) Date of Patent: Jul. 24, 2001

(54) SINGLE CRYSTAL PROCESSING BY IN-SITU SEED INJECTION

(75) Inventors: Evangellos Vekris; Nainesh J. Patel; Murali Hanabe, all of Plano, TX (US)

(73) Assignee: Ball Semiconductor Inc., Allen, TX (US)

( * ) Notice: Subject to any disclaimer, the term of this patent is extended or adjusted under 35 U.S.C. 154(b) by 0 days.

(21) Appl. No.: 09/363,420

(22) Filed: Jul. 29, 1999

Related U.S. Application Data

(63) Continuation-in-part of application No. 09/209,653, filed on Dec. 10, 1998.
(60) Provisional application No. 60/092,376, filed on Jul. 10, 1998.

(51) Int. Cl.[7] ...................................................... C30B 9/00
(52) U.S. Cl. ........................ 117/204; 117/200; 117/900; 422/245.1
(58) Field of Search ................................... 117/200, 204, 117/900; 422/245.1, 251

(56) References Cited

U.S. PATENT DOCUMENTS

| Re. 31,473 | 12/1983 | Kilby et al. ............................ 425/6 |
| 4,738,831 | 4/1988 | Naumann et al. . | |
| 5,069,740 | 12/1991 | Levine et al. . | |
| 5,560,543 | 10/1996 | Smith et al. ....................... 239/102.2 |
| 5,817,173 | * 10/1998 | Nakata ..................................... 117/73 |
| 6,120,602 | 9/2000 | Stephens et al. .................... 117/200 |

FOREIGN PATENT DOCUMENTS

| 2503452 | 7/1975 | (DE) . | |
| 4427686 | 2/1995 | (DE) . | |
| 0947613 | 10/1999 | (EP) . | |
| 59-117109 | 7/1984 | (JP) ............................ H01L/21/208 |
| 8-133899 | 5/1996 | (JP) ........................................ 29/60 |
| 10033969 | 2/1998 | (JP) . | |

* cited by examiner

*Primary Examiner*—Felisa Hiteshew
(74) *Attorney, Agent, or Firm*—Haynes and Boone LLP

(57) ABSTRACT

A system and method for processing crystals is disclosed. The system includes a receiver tube for receiving semiconductor granules. The granules are then directed to a chamber defined within an enclosure. The chamber maintains a heated, inert atmosphere with which to melt the semiconductor granules into a molten mass. A nozzle, located at one end of the chamber, creates droplets from the molten mass, which then drop through a long drop tube. As the droplets move through the drop tube, they form spherical shaped semiconductor crystals. The drop tube is heated and the spherical shaped semiconductor crystals may be single crystals. An inductively coupled plasma torch positioned between the nozzle and the drop tube melts the droplets, but leaving a seed in-situ, or the droplets may be melted and a seed injected in-situ. The seed can thereby facilitate crystallization.

5 Claims, 8 Drawing Sheets

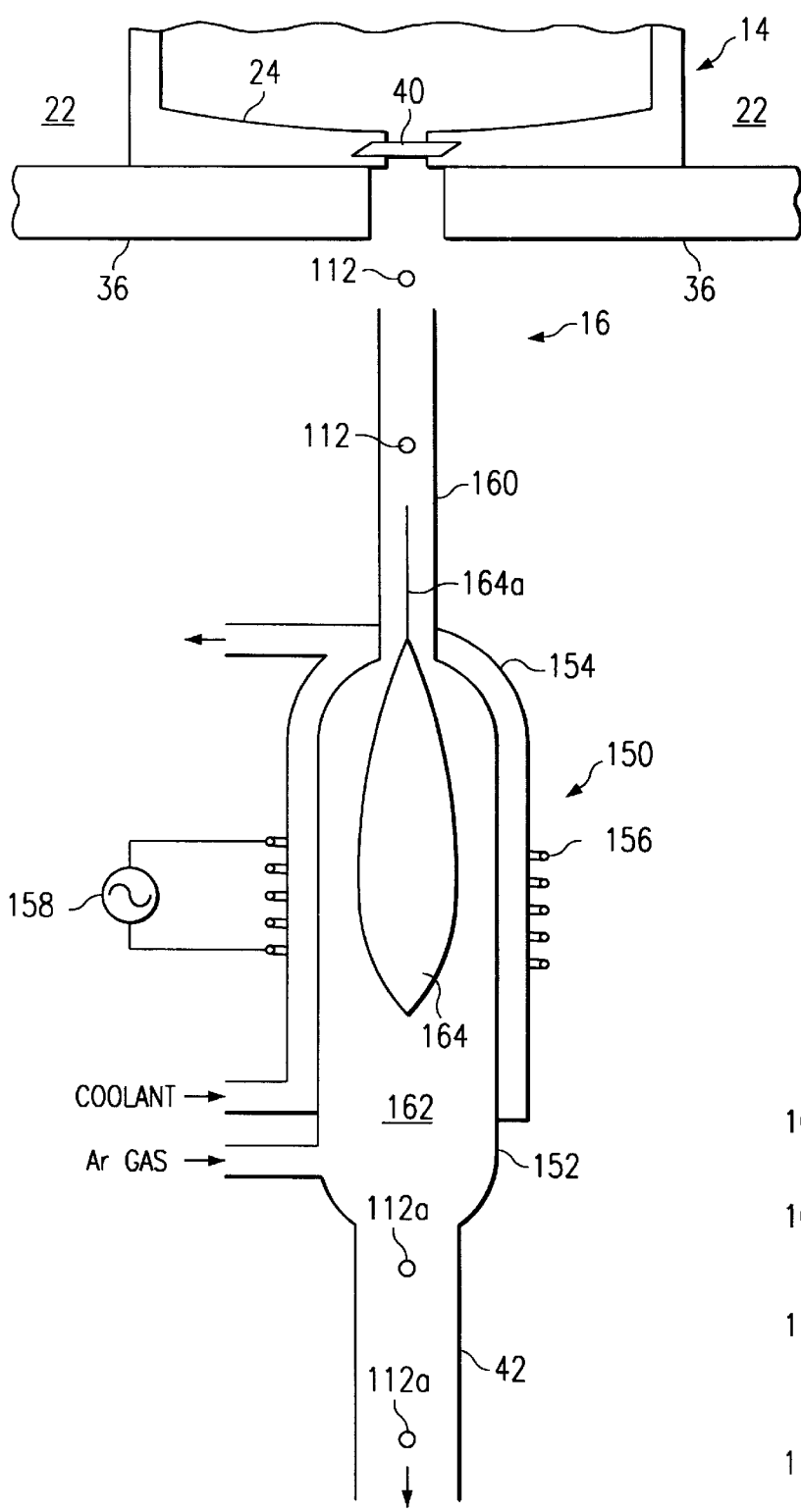
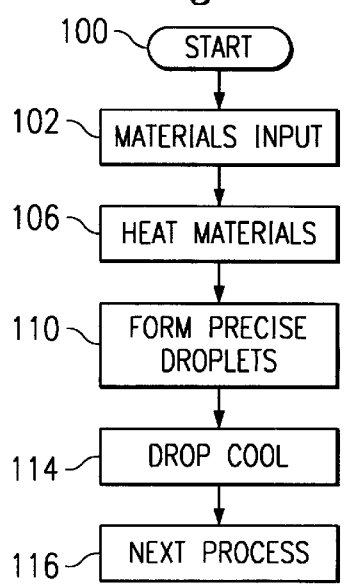

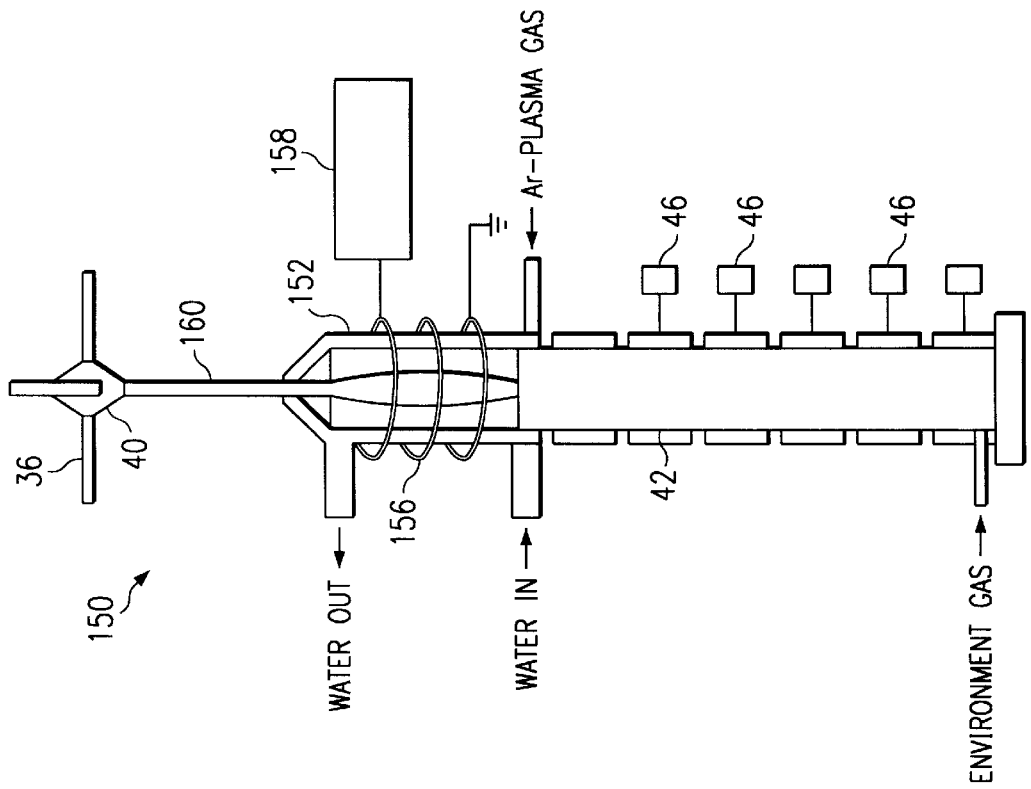
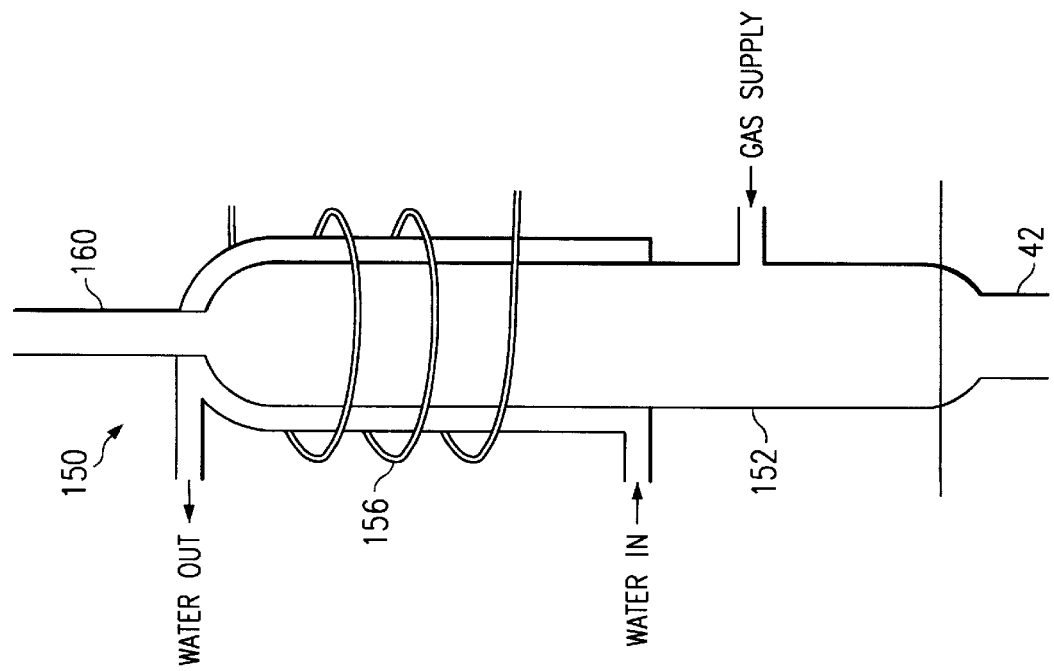

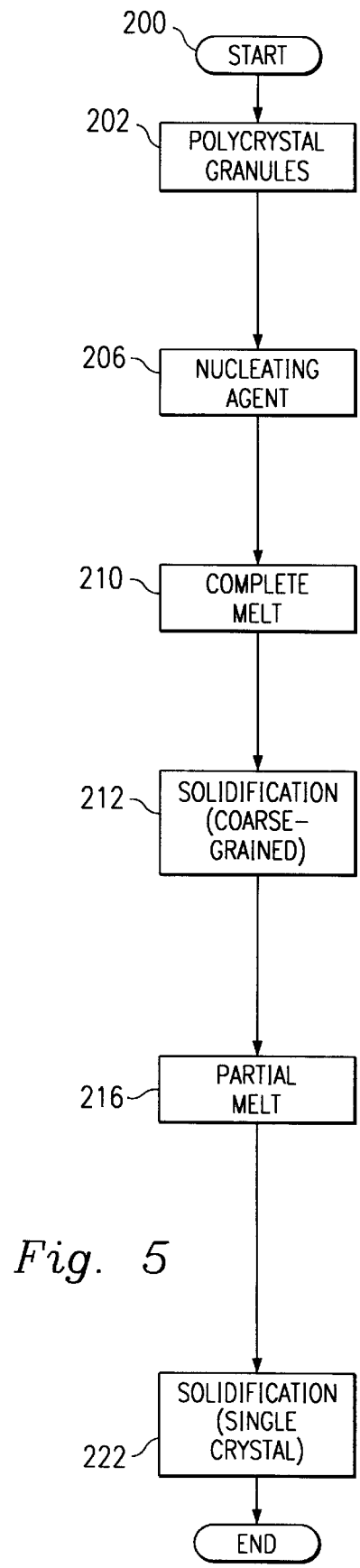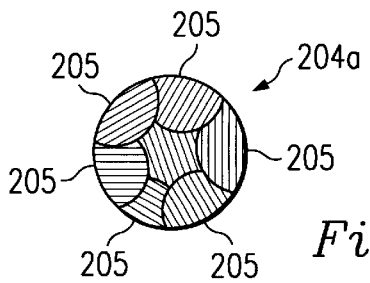
Fig. 6a
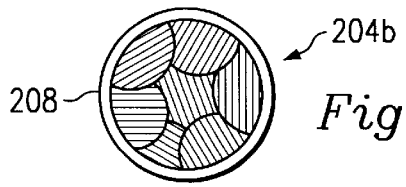
Fig. 6b
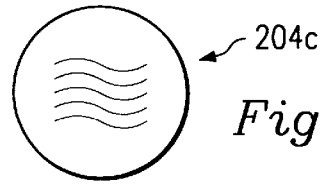
Fig. 6c
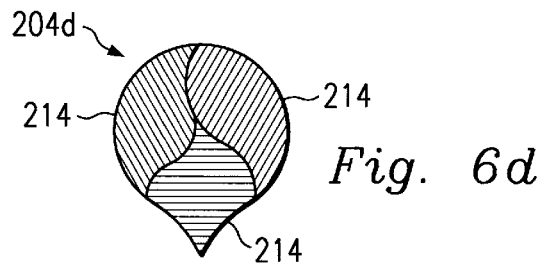
Fig. 6d
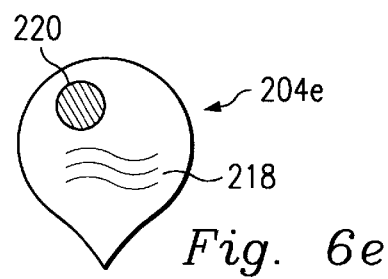
Fig. 6e
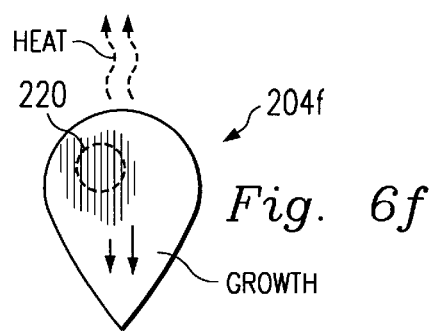
Fig. 6f
Fig. 5

SINGLE CRYSTAL PROCESSING BY IN-SITU SEED INJECTION

CROSS REFERENCE

This disclosure is a continuation-in-part of patent application U.S. Ser. No. 09/209,653 filed Dec. 10, 1998, which claims the benefit of provisional patent application U.S. Ser. No. 60/092,376 filed Jul. 10, 1998.

BACKGROUND OF THE INVENTION

The invention relates generally to semiconductor devices, and more particularly, to an apparatus and method for forming a device such as a spherical-shaped semiconductor crystal.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

Manufacturing the wafers requires creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above process typically have many defects. These defects can be attributed to the difficulty in making a single, highly pure crystal due to the cutting, grinding and cleaning processes as well as impurities associated with containers used in forming the crystals. These defects become more and more prevalent as the integrated circuits formed on these wafers contain smaller and smaller dimensions.

In co-pending U.S. patent application Ser. No. 08/858,004 filed on May 16, 1997, a method and apparatus for manufacturing spherical-shaped semiconductor integrated circuit devices is disclosed. Although certain manufacturing methods for making spherical shaped crystals are disclosed in the above-referenced application, an improved method of making the spherical shaped crystals, which includes fewer defects and is more manufacturable, is desired.

SUMMARY OF THE INVENTION

The present invention, accordingly, provides an apparatus and method for processing crystals. To this end, one embodiment provides a receiver tube for receiving semiconductor granules. The granules are then directed to a chamber defined within an enclosure. The chamber maintains a heated, inert atmosphere with which to melt the semiconductor granules into a molten mass. A nozzle, located at one end of the chamber, creates droplets from the molten mass, which then drop through a long drop tube. As the droplets move through the drop tube, they form the spherical shaped semiconductor crystals.

In another embodiment, the drop tube is heated with an inductively coupled plasma torch located between the nozzle and the drop tube. The plasma torch melts the droplets, thereby decreasing the number of crystalline directions in the droplet.

In yet another embodiment, spherical shaped crystals are formed from polycrystal granules. The polycrystal granules are melted into a seed and a molten mass. The molten mass then solidifies around the in-situ seed. As a result, the molten mass creates a crystal with crystalline directions identical to those of the seed.

In a further embodiment, polycrystal granules are melted into a molten mass. The molten mass is then brought into contact with a single crystal seed which becomes embedded within the molten mass. The molten mass then solidifies around the in-situ seed, and creates a crystal with crystalline directions identical to those of the seed.

In still another embodiment, before the polycrystal granules are formed into the spherical shaped crystals, they are coated with a nucleating agent. Once coated, the granules are completely melted and then re-solidified. By so doing, the resulting polycrystal granules have fewer crystalline directions, which promotes the ability to form a single crystal seed.

In different embodiments, different structures may be utilized, some of which may not come into physical contact with any of the polycrystal granules, droplets, or other material.

BRIEF DESCRIPTION OF THE DRAWINGS

FIG. 2 is a flow chart of a method for making crystal spherical devices using the processor of FIG. 1.

FIGS. 3, 3a and 3b illustrate a plasma torch for use with the processor of FIG. 1.

FIG. 5 is a flow chart of a method for making single crystal spherical devices.

FIGS. 6a–6f are illustrations of different stages of a single crystal spherical device produced according to the method of FIG. 5.

DESCRIPTION OF THE PREFERRED EMBODIMENT

Figure 1:
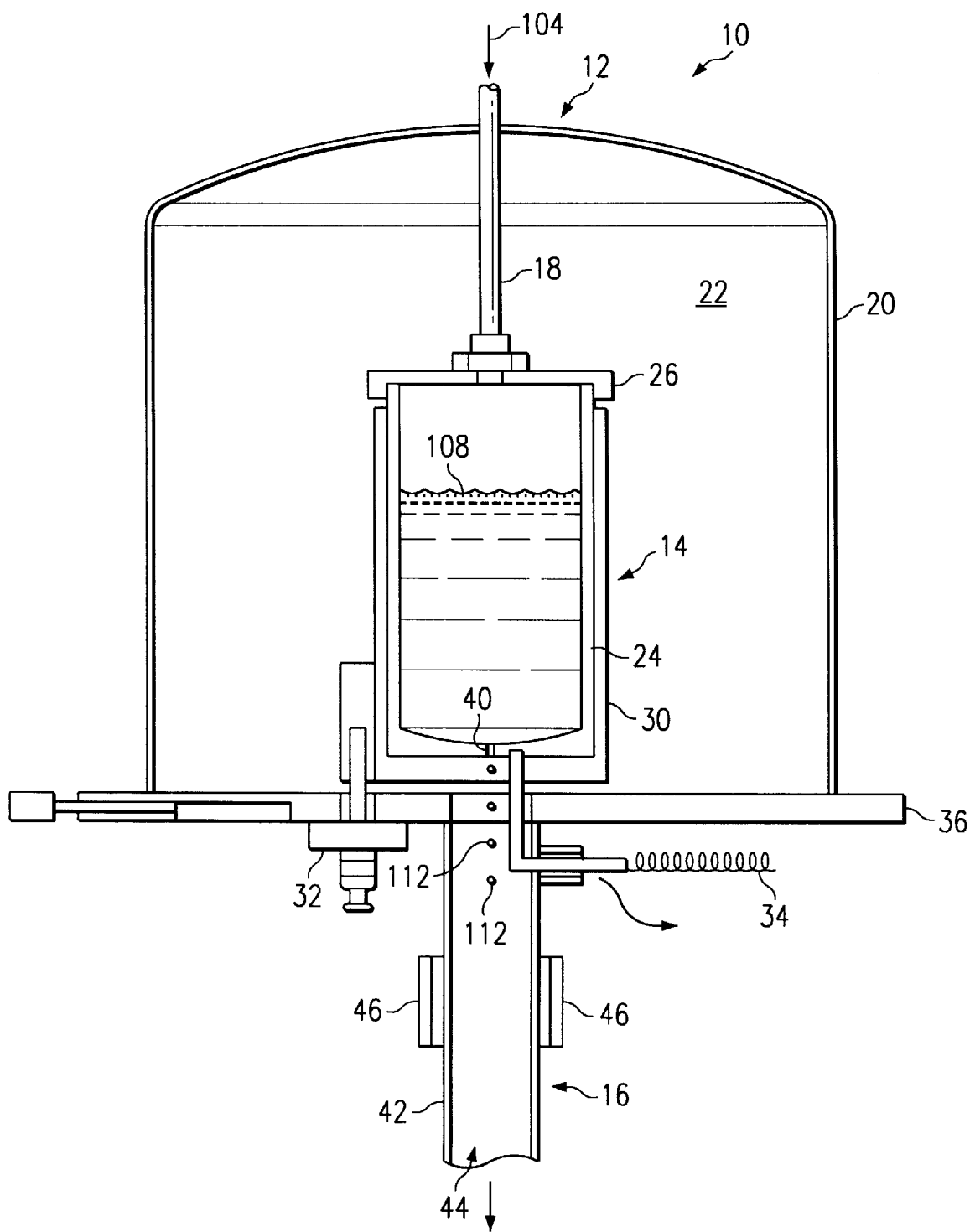
FIG. 1 illustrates a side, cut-away view of a processor according to one embodiment of the invention.
Figure 4A:
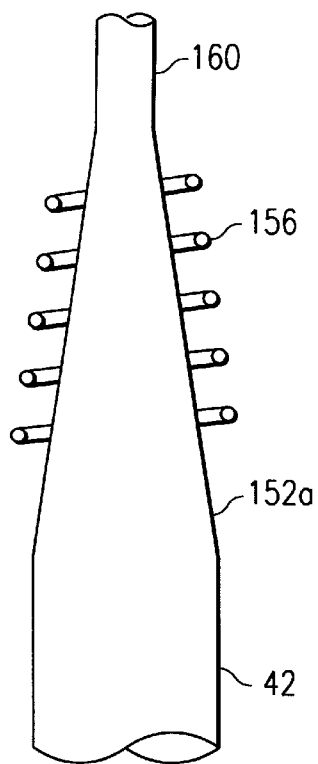
FIGS. 4a–4d are examples of different shaped quartz tubes for use with the plasma torch of FIG. 3.
Figure 4B:
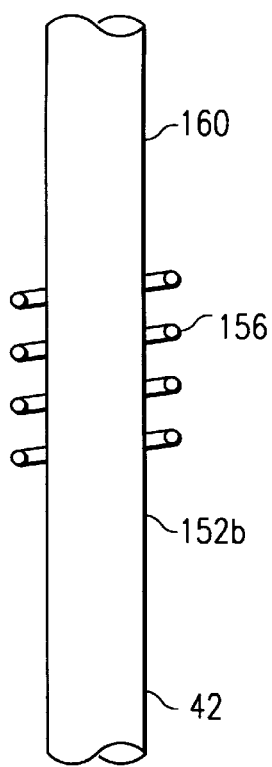
Figure 4C:
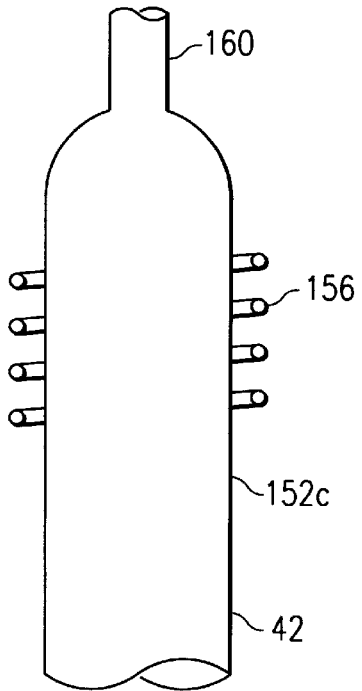
Figure 4D:
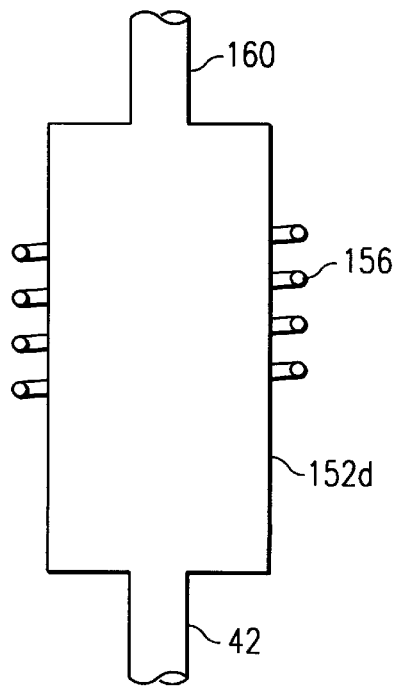

Referring to FIG. 1, the reference numeral 10 designates, in general, one embodiment of a processor for forming spherical shaped semiconductor crystals and/or solar cell crystals. Formation of the crystals may be facilitated in different manners by varying parameters described herein, including repetitive processing through portions of the processor 10.

The processor 10 can be separated into three sections: an input section 12, a main furnace section 14, and a dropper section 16. The input section 12 includes a receiver tube 18 for receiving processing materials, such as granules, gases and the like. The receiver tube 18 is about 2 centimeters in diameter and registers with the main furnace section 14

An enclosure 20 surrounds the main furnace section 14 and supports a general environment for processing. The enclosure is filled with an insulative material 22 to contain the relatively high temperatures produced in the main furnace section. The enclosure 20 and insulative material 22 provide an inert atmosphere, which prevents burnout of the insulation material 22 and other components stored therein. Disposed within the insulative material is a crucible 24. The crucible serves to hold molten semiconductor material, yet not react with the material.

A lid 26 of the crucible 24 connects to the receiver tube 18. In the present embodiment, the lid is threadably engaged to the receiver tube to facilitate removal and separation of the various components. The lid 26 further maintains the inert atmosphere inside the enclosure. Alternative embodiments may have other types of lids that either temporarily or permanently secure the receiver tube 18 to the crucible 24. The receiver tube 18 can either batch feed or continuously feed raw semiconductor material from the crucible 24. For each type of feeding, a different lid 26 may be required.

Immediately surrounding the outside of the crucible 24 is a furnace 30. In the present embodiment, the furnace is a fluid-heat type furnace, although other sources of heat may be used. The furnace 30 includes a fluid nozzle 32 through which the fluid may pass. The fluid nozzle 32 further maintains the inert atmosphere inside the enclosure 20. Although not shown, another device may be used to heat the fluid before it passes through the fluid nozzle 32. Also, a heat measurement device 34, such as a thermocouple, is attached to the furnace 30 for monitoring the temperature of the furnace 30 and of the crucible 24.

The enclosure 20, along with the crucible 24, rests on a support platform 36. The platform has several apertures to facilitate the various devices and processes herein disclosed. The platform 36 is also able to withstand some of the severe heat that radiates from the furnace 30 while maintaining the inert atmosphere inside the enclosure 20.

Attached to a bottom portion of the crucible 24, as seen in FIG. 1, is a dropper 40. Although not shown, the dropper 40 may include a nozzle that injects precise sized droplets of molten semiconductor material from the crucible 24 and into the dropper section 16. In one embodiment, the nozzle may be according to U.S. Pat. No. 5,560,543, entitled Heat-resistant Broad-bandwidth Liquid Droplet Generators. Alternatively, or in combination with the nozzle, inert gas may also be applied to facilitate the precise amounts of molten semiconductor material being injected into the dropper section 16.

The dropper section 16 includes a long drop tube 42. For example, the drop tube 42 may be stainless steel with an electro-polished inside finish, about five to ten centimeters in diameter and about ten meters in length. The drop tube 42 includes apertures so that a cooling gas 44 may flow therein. The cooling gas may also include impurities for doping the semiconductor material to a desired level. In some embodiments, a heater 46 is placed adjacent to the drop tube 42. The heater 46 helps to reduce the number of different crystalline growth directions by slowing the cooling process.

Referring to FIG. 2, a method 100 may be used in conjunction with the processor 10. At step 102, material 104 is placed into the receiver tube 18. For the sake of example, the material includes silicon, it being understood that different types of semiconductor material may also be used. The material 104 may also include an inert carrier gas, such as argon, and one or more dopant materials.

At step 106, the material 104 passes through the lid 26 and into the main furnace section 14. The furnace 30 can produce temperatures of about 1600° C., which far exceed the melting point of silicon (1410° C.). This high temperature causes the material 104 to become a molten mass 108. At step 110, the nozzle 40 allows droplets 112 of the molten mass to leave the crucible 24 and enter the dropper section 16. At step 114, the droplets 112 fall down the drop tube 42. The drop tube will allow the droplets to cool and form a polycrystalline structure. The cooling gases 44 may be, for example, helium, hydrogen, argon, or nitrogen to facilitate the cooling of the droplets. The cooling gases 44 may also be used to control the rate of descent of the droplets 112.

In some embodiments, the processor 10 controls the rate at which the droplets 112 cool. This may occur by many different methods. For example, the cooling gases 44 may be heated. Also, the drop tube 42 may be heated by the heaters 46. As a result, the droplets 112 will cool very slowly, thereby forming crystals. In additional embodiments, such as those discussed with reference to FIG. 3 below, the heaters 46 may actually melt the droplets. At step 114, the cooled droplets are then transferred to a next operation for processing.

Referring to FIGS. 3, 3a, and 3b, in another embodiment, an inductively coupled plasma ("ICP") torch 150 is positioned above the drop tube 42. The ICP torch 150 includes a quartz tube 152 made of a high temperature material, for example, ceramic. Surrounding the quartz tube 152 is a cooling system 154. The cooling system may include water or any other type of coolant to help prevent the quartz tube 152 from melting.

Also surrounding the quartz tube 152 is a conductive coil 156. In the present embodiment, the conductive coil 156 is a hollow copper coil attached to a radio frequency ("RF") energy generator 158. Because the coil 156 is hollow, air or other fluid can flow therethrough to help lower the temperature of the coil.

An entry tube 160 is attached to the quartz tube 152 for receiving the droplets 112 (FIG. 1) and directing them towards a central chamber 162 of the quartz tube. Although not shown, a shield may be provided to prevent radiation losses from plasma in the tube 160.

In operation, an argon gas flows at atmospheric pressure inside the quartz tube 152. The RF generator 158 operates at a desired frequency to heat the gas, thereby creating a plasma flame 164. The plasma flame 164 is at a temperature between 8000° K to 10,000° K, which depends on the gas flow rate and torch dimensions. A portion of the flame 164a extends into the entry tube 160 and serves as a preheater.

When a droplet 112 enters the entry tube 160, it is quickly preheated by the plasma flame 164a. The droplet 112 then enters the central chamber 162 where the plasma flame 164 melts it. Because the temperature of the flame 164 is so high, impurities in the droplet 112 will vaporize. As the droplets exit the central chamber 162, they solidify to form crystals 112a. The crystals 112a advance through the drop tube 42 where they cool, as described above with reference to FIGS. 1 and 2.

In many instances, the crystals 112a are single crystal granules with a consistent, uniform crystalline direction. However, in other instances, the crystals 112a may be polycrystal granules with multiple crystalline directions. It is understood, however, that the polycrystals produced by the drop tube 42 will have fewer different crystalline directions than the droplets 112, i.e., there are fewer crystalline structures in a single granule.

Referring to FIGS. 4a–4d, the quartz tube 152 can take on various shapes and sizes that will affect both the plasma flame 164 as well as the portion 164a. Therefore, it is anticipated that different quartz tubes, such as quartz tubes 152a–d, can be utilized to accommodate different requirements of the heater 46.

Referring to FIG. 5, to facilitate the formation of single crystalline material with the above described devices and methods, an in-situ seeding process 200 may be used. Forming single crystalline materials by non-contact processing is difficult because the solidification of the material may not be unidirectional, and hence polycrystal. Uniform crystalline direction is facilitated using a seed or a crystal nucleating agent. The in-situ seeding process 200 may utilize a non-contact processing technique in which a seed is introduced in-situ into the material by controlling the melting of the feed material.

FIGS. 6a–6f provide illustrations and examples of intermediate material configurations for each step of the in-situ seeding process 200. Furthermore, exemplary processing details are provided with FIGS. 6a–6f. It is understood, however, that the illustrations and examples of FIGS. 6a–6f are only provided for the sake of clarity and are not intended to limit the invention in any way.

At step 202 of FIG. 5, a first step in the formation of single crystal silicon spheres is to obtain a polycrystalline granule.

Referring also to FIG. 6a, an illustration of a polycrystalline granule is designated with a reference numeral 204a. The polycrystalline granule 204a has several crystalline structures 205 and may be produced by one of the above-described processes or another process all together. Referring to FIG. 1 for one example, the processor 10 may be used to produce the polycrystalline granule 204a, which in FIG. 1, is designated as the droplet 112.

At step 206 of FIG. 5, a nucleating agent is provided to coat the polycrystalline granule to produce a coated granule. The nucleating agent may be supplied from an external source and sprayed onto the poly-crystalline granule.

Referring also to FIG. 6b, an illustration of a coated granule is designated with a reference numeral 204b. A nucleating agent 208 in the form of a seeding powder is applied around the polycrystalline granule 204a to produce the coated granule 204b. For example, the seeding powder may be boron nitride or quartz. Other nucleating agents can be used, although materials that provide a good nucleating site and have minimal solubility in liquid silicon are desirable. Referring to FIG. 3 for example, the nucleating agent 208 can be applied in the entry tube 160.

At step 210 of FIG. 5, the coated granule passes through a heating zone until it is completely melted.

Referring also to FIG. 6c, an illustration of a completely melted granule is designated with a reference numeral 204c. For example, the melted granule 204c may pass through an ICP torch at a controlled rate, such as is described with respect to FIG. 3. The melted granule 204c is extremely pure from the non-contact processing. Non-contact processing techniques may also include levitating the coated granules 204b by an energy source such as electromagnetic induction, acoustic, electrostatic, aerodynamic, plasma or combination-type sources. In the case of electromagnetic and plasma levitation processes, the levitation energy may also be used for melting. Although not shown, the nucleating coat is still present around the outside of the melted granule 204c.

At step 212 of FIG. 5, the molten granule solidifies to form a course-grained granule with a relatively few number of polycrystals.

Referring also to FIG. 6d, an illustration of a solidified course-grained granule is designated with a reference numeral 204d. The granules 204d may solidify while dropping through a tube, such as the drop tube 42 described in FIG. 1. The temperature for solidification may be controlled by heaters surrounding the tube and an atmosphere of Ar, He or a mixture of both may be maintained in the tube. The course-grained granule 204d has a plurality of polycrystals 214, however, the number of polycrystals 214 is less than the number of polycrystals 205 of FIG. 6b. This is because the nucleating agent 208 seeds crystal growth in a limited number of directions as the granule 204d solidifies.

At step 216 of FIG. 5, the solidified course-grained granule is remelted. This time, however, the material is partially melted and a seed is left in-situ, or in place. The seed will be in-situ because it will "float" inside the molten material. Also, because the course-grained granule from step 212 consists of a relatively few number of polycrystals, it is likely that the seed will be single crystal, with a single growth direction. As in step 212 above, it is understood that any type of heating and melting may be used to remelt the material.

Referring also to FIG. 6e, an illustration of a partially-melted granule is designated with a reference numeral 204e. The granule 204e has a significant portion of molten material 218 and a small seed 220 floating therein. The melting process may be the same process used above with respect to step 212, except instead of levitating the granule, it is allowed to drop through a drop tube, such as the drop tube 42 of FIG. 1. The temperature for solidification may be controlled by heaters, such as the heaters 46, and an atmosphere of Argon and/or Helium may be maintained in the tube 42.

At step 222 of FIG. 5, the partially-melted granule is cooled at a control rate. Because the granule includes a seed in-situ, crystalline patterns will be determined from the seed. If the seed is single crystal, as desired, the granule will cool into a larger, single crystal device.

Referring also to FIG. 6f, an illustration of a single crystal semiconductor device is designated with a reference numeral 204f. The device 204f has a grain direction that is consistent with the grain direction of the seed 220 (shown in phantom) from FIG. 6e. It is understood that the device 204f may not be entirely spherical in shape. For the sake of explanation, the device 204f is illustrated as having a "tear drop" shape. If the tear drop shape is unacceptable, various polishing techniques can be used to smooth the device 204f into a more perfect sphere.

As a result, the single crystal semiconductor device 204f is very pure, due to the non-contact processing and use of the in-situ seeding. Also, if for some reason, the seed produced in step 216 is polycrystal, the process 200 can be repeated, beginning at step 216.

Figure 7:
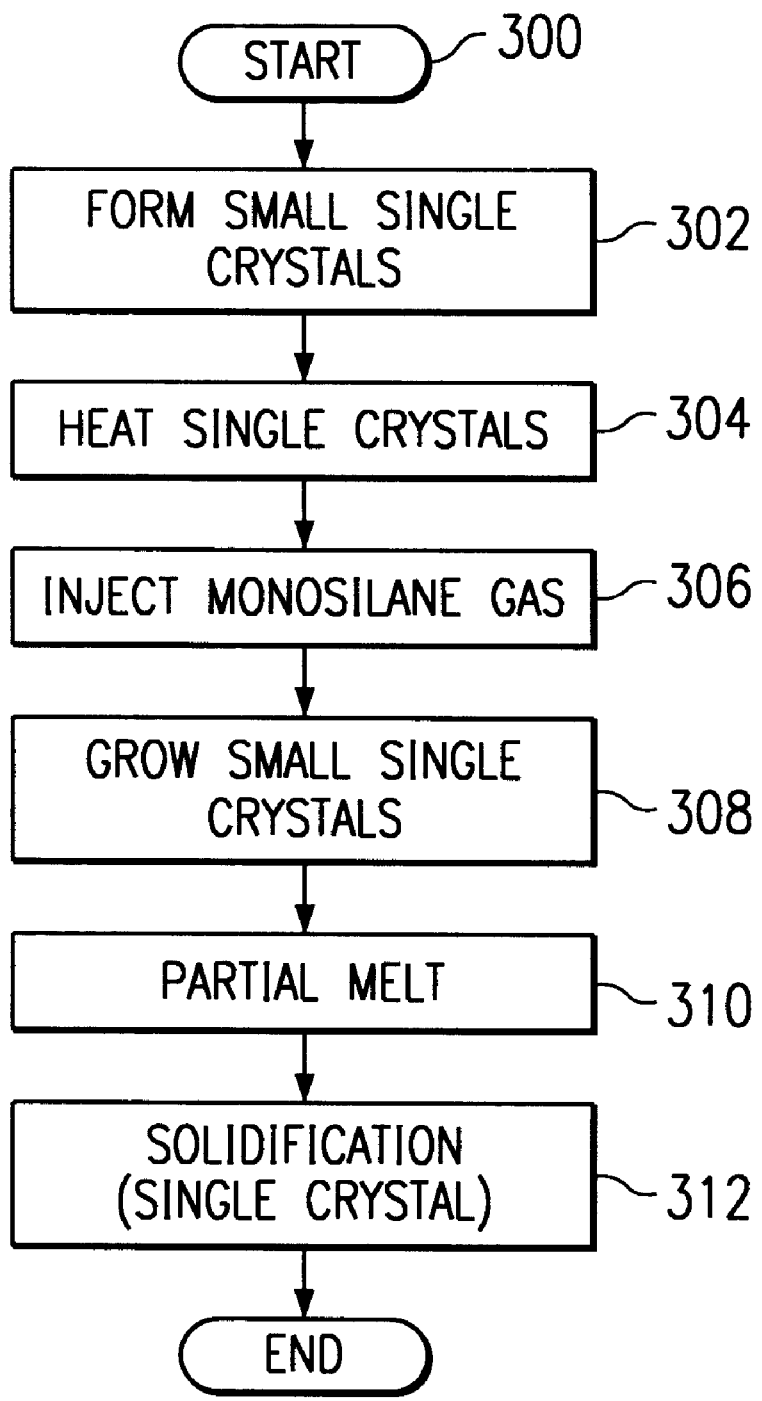
FIG. 7 is an illustration of another method that may be used to facilitate the formation of single crystalline material employing devices and methods of various embodiments of the invention.

Referring now to FIG. 7, another method 300 may be used to facilitate the formation of single crystalline material with the above described devices and methods. The method 300 uses systems and methods described above as well as in co-pending U.S. patent application Ser. No. 08/858,004 filed on May 16, 1997, which is herein incorporated by reference.

At step 302, small single crystal particles are formed, such as by epitaxial growth using a method of presently incorporated U.S. patent application Ser. No. 08/858,004. At step 304, the single crystal particles are then fed into a fluidized bed reactor, which can be heated to a temperature that meets or exceeds the melting of Si. One example of a fluidized bed reactor is disclosed in the presently incorporated U.S. patent application Ser. No. 08/858,004. At step 306, a gas mixture, such as monosilane and Argon, is fed into the reactor. At step 308, when the monosilane gas reaches a critical temperature, it decomposes to silicon vapor and hydrogen. At step 310, the silicon vapor deposits on the single crystal particle and grows in size as a granule. If the temperature is high enough, epitaxial growth can occur and the resulting granule will be a single crystal. Otherwise, the resulting granule will be a polycrystal with a single crystal core.

At step 312, the granule is partially melted so that the outer polycrystalline layer is melted. This is similar to step 216 of FIG. 5. The unmelted single crystal core now acts as a seed for the rest of the molten silicon. Upon solidification, the partially molten granule converts to a single crystal. This is similar to step 222 of FIG. 5.

Figure 8:
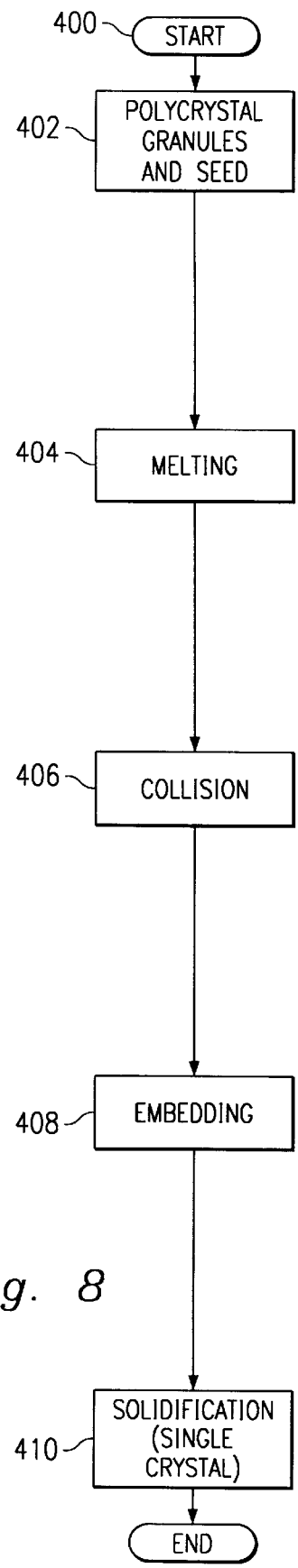
FIG. 8 is a flow chart of a method for making single crystal spherical devices by in-situ seed injection.

Referring now to FIG. 8, in another embodiment, an in-situ seed injection process 400 may be used to facilitate the formation of single crystalline material with the above described devices and methods. The in-situ seed injection process 400, like that of the in-situ seeding process 200 described with respect to FIG. 5, facilitates the formation of single crystalline materials by non-contact processing. The in-situ seed injection process 400 may utilize a non-contact processing technique in which a seed is introduced in-situ into the material by injecting a single crystal seed into a liquid sample of semiconductor material.

FIGS. 9a–9e provide illustrations and examples of intermediate material configurations for each step in the in-situ seed injection process 400. Furthermore, exemplary processing details are provided with FIGS. 9a–9e. It is understood, however, that the illustrations and examples of FIGS. 9a–9e are only provided for the sake of clarity and are not intended to limit the invention in any way.

At step 402 of FIG. 8, a first step in the formation of single crystal silicon spheres is to obtain a polycrystal granule and a single crystal seed.

Figure 9A:
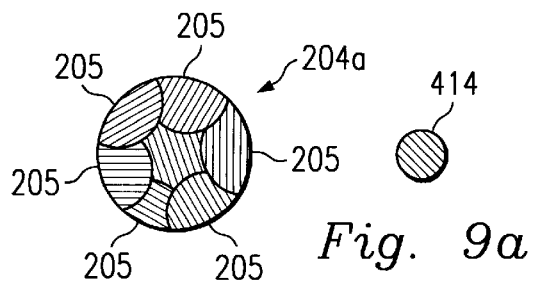
FIGS. 9a–9e are illustrations of different stages of a single crystal spherical device produced according to the method of FIG. 8.

Referring also to FIG. 9a, an illustration of a polycrystal granule is designated with a reference numeral 204a, such as is described with respect to FIG. 6a. An illustration of a single crystal seed is designated with a reference numeral 414. The polycrystal granule and the seed should be of the same material, but they can be processed by different methods. For example, the polycrystal granule can be of semiconductor grade silicon, while the seed can be produced by means of any technique that results in monocrystallinity. Also, the seed can be doped, and thus serve as a vehicle for the introduction of impurities (i.e., dopants) into the sample. In this application, the composition of the seeded granule can later be made homogeneous by thermal treatment.

At step 404 of FIG. 8, the polycrystal granule passes through a heating zone until it is completely melted. For example, the polycrystal granule may pass through an ICP torch at a controlled rate, such as is described with respect to FIG. 3.

Figure 9B:
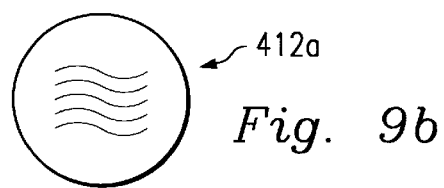

Referring also to FIG. 9b, an illustration of a completely melted granule is designated with a reference numeral 412a. The melted granule is extremely pure from the non-contact processing technique, examples of such techniques being described with respect to FIG. 6c.

At step 406 of FIG. 8, the seed comes into contact with, and enters, the melted granule.

Figure 9C:
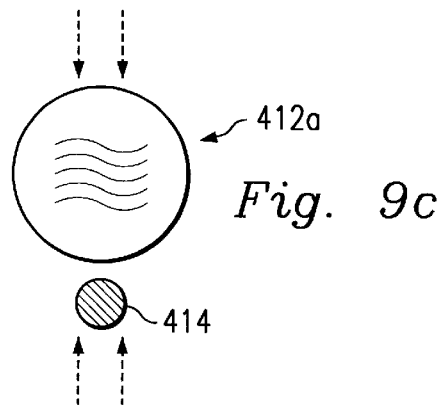

Referring also to FIG. 9c, an illustration of the movement of the melted granule 412a towards the seed 414, and visa versa, is designated by arrows indicating the direction of movement of both the melted granule and seed. The seed 414 may be introduced to the melted granule 412a in any number of ways. For example, with reference to FIG. 3, the seed may be introduced into the Argon supply line of the ICP torch, and then contact the melted granule as it falls, preferably after the granule has exited the plasma torch region. Also, for example, with reference to FIG. 3, the seed may be introduced into the top of the ICP torch in which the melted granule is being suspended; the seed falls through the plasma flame and comes into contact with the melted granule being levitated below the flame. Upon incorporation of the seed by the levitating melted granule, the melted granule becomes too massive to be levitated by the existing gas flow, and the seeded melted granule automatically drops into the drop tube below. While the seed may melt some during many of the different incorporation processes, at least a portion remains in solid form to embed within the melted granule.

At step 408 in FIG. 8, the seed embeds itself within the melted granule. The seed will remain in-situ (i.e., in place) within the melted granule, as is described with reference to step 216 of FIG. 5. While the seed may melt some during the embedding, at least a portion remains solid in-situ within the melted granule.

Figure 9D:
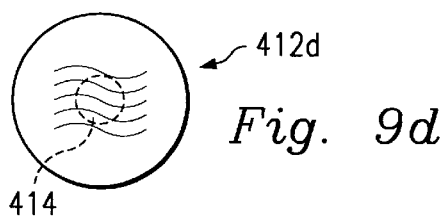

Referring also to FIG. 9d, an illustration of the melted granule with the seed 414 (shown in phantom) embedded is designated with a reference numeral 412d. The injected seed provides the melted granule with a nucleating surface around which the melted granule can solidify in a monocrystalline manner.

At step 410 in FIG. 8, the melted granule solidifies around the seed. Because the granule includes a seed in-situ, crystalline patterns will be determined from the seed, as is described with reference to step 222 of FIG. 5.

Figure 9E:
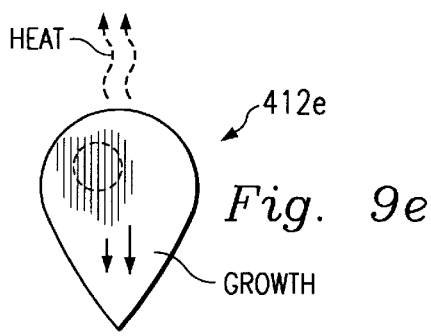

Referring also to FIG. 9e, an illustration of a single crystal semiconductor device is designated with a reference numeral 412e. The device 412e has a grain direction that is consistent with the grain direction of the seed 414 (shown in phantom) from FIG. 9d. It is understood that the device 412e may not be entirely spherical in shape. For the sake of explanation, the device 412e is illustrated as having a "tear drop" shape. If the tear drop shape is unacceptable, various polishing techniques can be used to smooth the device 412e into a more perfect sphere. As a result, the single crystal semiconductor device 412e is very pure, due to the non-contact processing and use of the in-situ seed injection.

Figure 10:
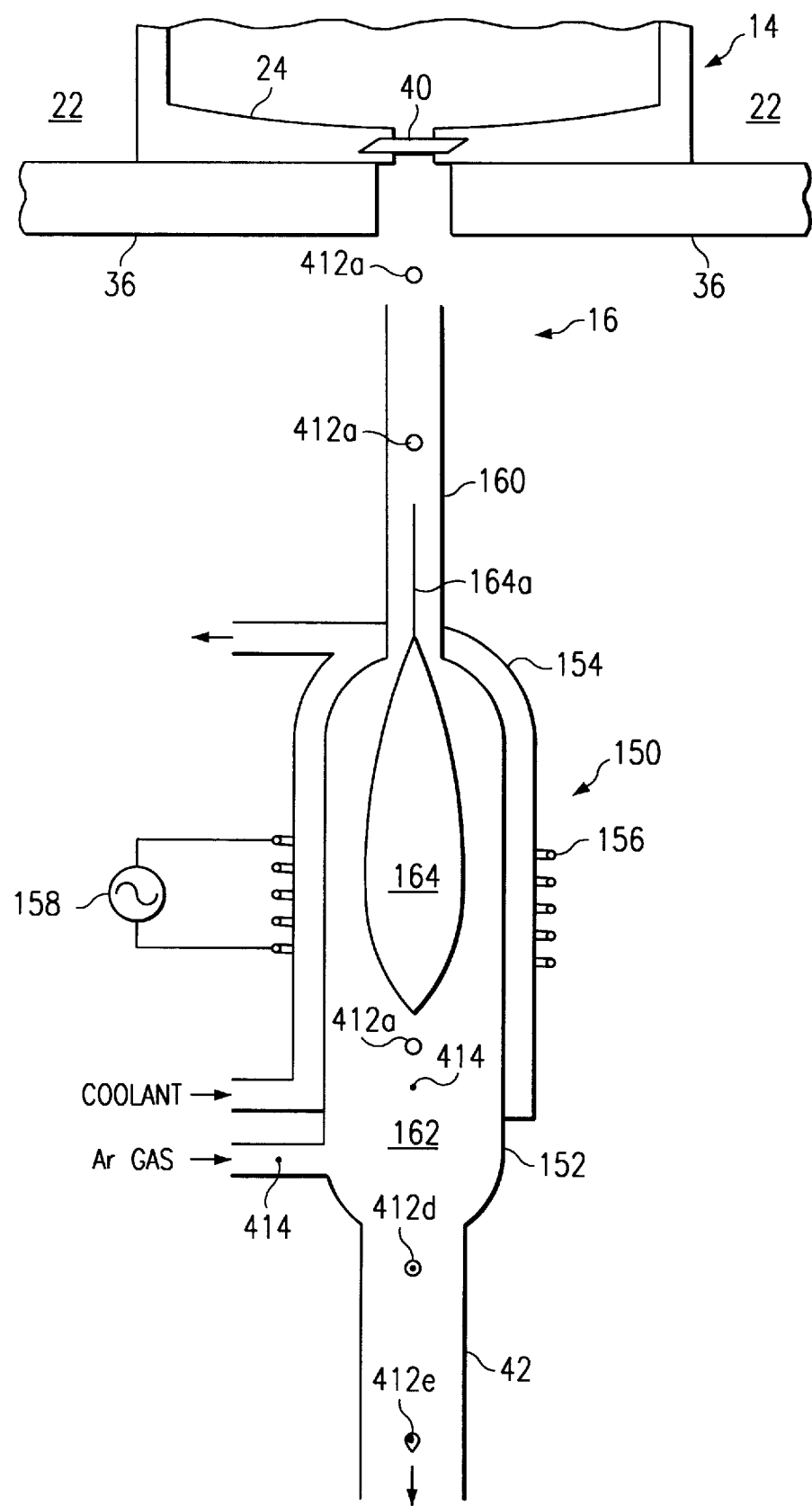
FIG. 10 illustrates a plasma torch, for use with the processor of FIG. 1, incorporating a method for making single crystal spherical devices by in-situ seed injection, according to one embodiment of the invention.

Referring to FIG. 10, an ICP torch, such as is described with reference to FIG. 3, is used in operation according to the first example as described with reference to FIG. 9c. The single crystal seed 414 enters the central chamber 162 through the Argon supply line. The single crystal seed 414 then comes into contact, and embeds within the melted granule 412a, all inside the central chamber 162, preferably at a point below the plasma flame 164. As the seeded granules 412d exit the central chamber 162, they solidify to form crystals 412e. The crystals 412e advance through the drop tube 42, such as is described with reference to FIG. 3. Due to the continuous movement of the melted granule 412a and seed 414, this process is suitable for high-speed non-contact processing, by which a continuous stream of seeds 414 can be fed, in a synchronized manner, into the path of a continuous stream of falling melted granules 412a.

Several advantages result from the above-described embodiments. For one, the material seldom, if ever, comes in physical contact with any other device or any part of the processor 10. By melting the material without physical contact, less contaminants are introduced. Also, as the material drops or is levitated, it becomes spherical due to surface tension. Furthermore, single crystals can be formed either through controlled melting and cooling of the material, or by injecting a single crystal into the material. Further still, many crystals can be processed in rapid succession, with the crucible 24 continually being refilled.

It is understood that several variations may be made in the foregoing. For example, different heating steps may be used in different parts of the processor. Further still, a catcher (not shown) may be included to receive the material and facilitate the heating or cooling process. The catcher may also be used to return the material to a furnace section for additional processing. Other modifications, changes and substitutions are also intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A system for making a spherical shaped single crystal, the system comprising:

means for receiving a polycrystal granule;

means for receiving a single crystal seed;

means for completely melting the polycrystal granule into a molten mass;

means for contacting the molten mass and the single crystal seed, such contact resulting in the single crystal seed becoming embedded within the molten mass; and a non-contact environment for solidifying the molten mass around the embedded single crystal seed, wherein the molten mass creates crystalline directions identical to those of the seed to form the spherical shaped single crystal.

2. The system of claim 1 wherein the polycrystal granule and the single crystal seed are made from the same material.

3. The system of claim 1 wherein the single crystal seed includes impurities to introduce dopants to the molten mass.

4. The system of claim 1 wherein the means for melting never physically contacts the polycrystal granule.

5. The system of claim 1 wherein the means for receiving a polycrystal granule and the means for receiving a single crystal seed are arranged to facilitate a continuous, sequential processing flow for making multiple spherical shaped single crystals.

* * * * *